United States Patent [19]

Ohta

[11] Patent Number: 4,885,616
[45] Date of Patent: Dec. 5, 1989

[54] THIN FILM DISPLAY DEVICE WITH THIN AMORPHOUS CHANNEL

[75] Inventor: Masahiko Ohta, Tokyo, Japan

[73] Assignee: Seiko Instruments Inc., Tokyo, Japan

[21] Appl. No.: 88,528

[22] Filed: Aug. 21, 1987

Related U.S. Application Data

[63] Continuation of Ser. No. 783,764, Oct. 3, 1985.

[30] Foreign Application Priority Data

Oct. 9, 1984 [JP] Japan .................. 59-211671

[51] Int. Cl.$^4$ ............................. H01L 29/78
[52] U.S. Cl. ...................... 357/23.7; 357/2;
357/4; 357/59; 350/342
[58] Field of Search .............. 357/23.7, 59 C, 59 D,
357/23, 14, 4, 2; 350/330, 334, 342

[56] References Cited

U.S. PATENT DOCUMENTS

| | | | |
|---|---|---|---|
| 3,840,695 | 10/1974 | Fischer | 357/4 X |
| 4,040,073 | 8/1977 | Luo | 357/23.7 X |
| 4,065,781 | 12/1977 | Gutknecht | 357/23.7 |
| 4,752,814 | 6/1988 | Tuan | 357/23.7 |

OTHER PUBLICATIONS

Leonard et al., "Chromium Barrier for Terminal Metallurgies", *IBM Technical Disclosure Bulletin*, vol. 13, No. 5, Oct. 1970, p. 1121.
Ho et al., "Stable Junctions Between GaAs and Metal Contacts Using Transition Metals as Diffusion Barriers", *IBM Technical Disclosure Bulletin*, vol. 21, No. 4, Sep. 1978, p. 1753.
Tanaka et al., "A Thin-Film Transistor With a Very Thin a-Si:H Layer and Its Application for an LC Panel", *Appl. Phys. A*, 41, 311-314 (1986).

*Primary Examiner*—William Mintel
*Attorney, Agent, or Firm*—Bruce L. Adams; Van C. Wilks

[57] ABSTRACT

A picture element selective transistor with a staggered structure, for an active matrix type thin film liquid crystal display device, has a channel region layer thinner than 1000 Å so that the OFF electric current at the light irradiating time is reduced, whereby it is possible to omit a light-shielding layer, and simplify manufacturing process.

8 Claims, 1 Drawing Sheet

THIN FILM DISPLAY DEVICE WITH THIN AMORPHOUS CHANNEL

This is a continuation of application Ser. No. 783,764, filed Oct. 3, 1985, now abandoned.

BACKGROUND OF THE INVENTION

The present invention relates to an active matrix type liquid crystal display device manufactured by utilizing the thin film technique, and also relates to a picture element selective transistor which plays an important role in the liquid crystal display device.

Conventionally, in a general active matrix type thin film display device, as described, for example, in the U.S. Pat. No. 3,840,695, a thin film transistor with a staggered structure as shown in FIG. 2, has been utilized for picture element selective transistors, and a channel region (for example a-Si layer) 3 of the thin film transistor has normally a certain thickness, for example, 2000 Å to 4000 Å.

Because such a channel region exhibits a highly efficient photoelectric effect, a light-shielding thin film layer 9 has to be provided when the thin film transistor is utilized in a liquid crystal display device, and therefore the process of making becomes complicated, and the efficiency of the transistor is often lowered.

SUMMARY OF THE INVENTION

It is therefore an object of the present invention to solve the above defects and to provide a thin film display device produced by a simple process and having the same or better efficiency of transistor than that of the conventional devices.

It is another object of the present invention to provide a thin film display device which has a more even construction.

These and other objects and advantages are achieved by a thin display of the present invention which is constructed to ensure that the channel region (for example a-Si or amorphous silicon layer) 3 is formed extremely thin (for example less than 1000 Å), the absorption of light incident on the channel region is limited to its minimum, the increase of the OFF electric or photoelectric current caused by photoelectric effect is reduced to the extent where ON-OFF ratio of the transistor is sufficiently obtained (for example $10^3$ to $10^4$), and no light shielding film is necessary. However, by making the channel layer 3 thinner, and by applying the gate voltage minus relative to the channel region, the hole-carrier controlling N+ semi-conductive layer does not function in the case of utilizing some kinds of material as the metal electrode 6. This is because the electric current due to the hole-carrier passes through the channel region. To avoid the above adverse effect, a high melting-point metal or a thin film layer composed of a metal (e.g. Cr) is inserted between the metal electrode 6 and N+ semi-conductive layer 5.

DETAILED DESCRIPTION OF THE PREFERRED EMBODIMENT

Figure 1:
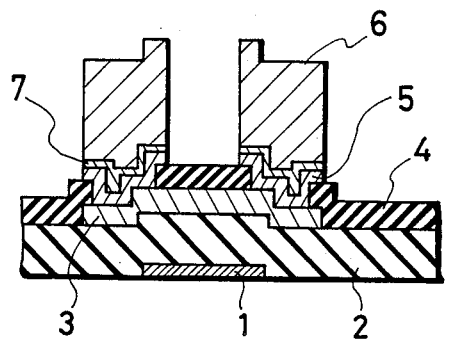
FIG. 1 is a sectional diagram of the structure of the thin film display device of the present invention.
Figure 2:
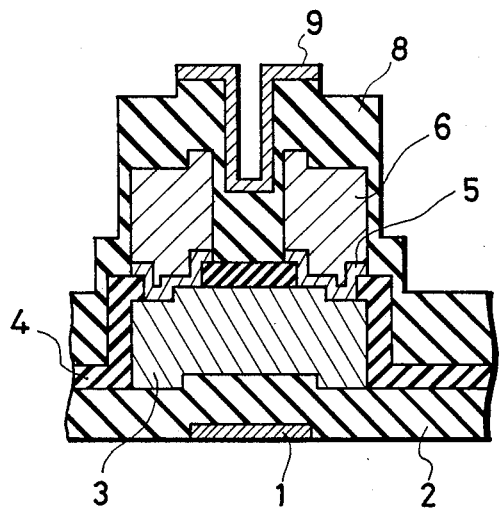
FIG. 2 is a sectional diagram of the structure of a conventional thin film display device.

The explanation of an embodiment of the present invention referring to the drawings is as follows.

Referring to FIG. 1, the layers are formed in the following order, from bottom to top; the substrate; the gate region 1; accumulated insulative film or first insulating layer (e.g. SiN) 2; extremely thin (e.g. thinner than 1000 Å) channel region (e.g. a-Si or amorphous silicon layer) 3; and accumulated inter-layer insulative or second insulating layer 4. After the above described layers are formed one over another a pair of openings for connecting source and drain electrodes to the chanel region is formed through the second insulating layer 4 to expose a part of the channel region, and on top of the channel region, drain and source regions composed of N+ semi-conductive layers 5 and source and drain metal electrodes 6 are respectively and selectively formed.

In case of utilizing some kind of material as metal electrode 6 (e.g. aluminium), such material diffuses into the N+ semi-conductive layer 5, whereby the electric current due to the hole-carrier tends to pass through the channel region by applying the gate voltage minus relative to the channel region.

To avoid the above adverse effect, thin film or intermediate layer 7 of a high melting-point metal or a material corresponding to the metal (e.g. Cr or Mo) is inserted between the metal electrode 6 and N+ semi-conductive layer 5.

Figure 3:
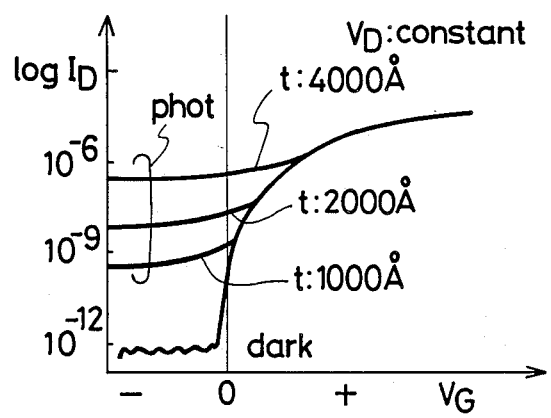
FIG. 3 is a graph showing the measurement at light irradiating time and the measurement in darkness, of the gate voltage $V_G$-drain current ID characteristic when the thickness of the channel region layers are selected differently.

FIG. 3 is a graph that shows the variation of the gate voltage $V_G$-drain current $I_D$ characteristic caused by the light irradiation (e.g. 4000 lx white light) incident to the channel region, when the thickness of the above channel region 3 is designed at 1000 Å, 2000 Å, and 4000 Å. When the thickness t of the channel region 3 is arranged at 4000 Å, the ON-OFF ratio of the transistor during irradiating light is only about $10^2$, but when the thickness t is arranged at 1000 Å, the ON-OFF ratio sufficient to drive a picture element that is, more than $10^4$ is obtained.

As explained as above, with the structure that limits the increase of the OFF electric or photoelectric current during the light irradiation to its utmost limits, it is possible to omit the light shielding process, and its manufacturing process can be sharply shortened. Also, with the above structure, it is possible to shorten the accumulating time of the thin film or channel region layer corresponding to the channel region, the distinction between each layers are sufficiently achieved, and it is possible to make the layers more even. Furthermore, as the high resistive region of the contact portion can be disposed between the semiconductive layer and the metal electrode layer, the saturation voltage of the drain voltage $V_D$-drain current $I_D$ characteristic can be restrained, and this feature is very preferable for driving this device. As above stated, several improvements can be found in this presently invented thin film transistor together with the merit of simplifying the process of manufacturing.

What is claimed is:

1. In a thin film display device having a liquid crystal panel and a picture element selective transistor formed on a substrate, said picture element selective transistor comprising:

a gate region formed on the substrate;

a first insulating layer formed on the gate region and the substrate;

a channel region layer composed of an undoped amorphous silicon single layer and having a thickness less than 1000 Å, the channel region layer being formed on the first insulating layer;

a second insulating layer formed on the channel region layer and the first insulating layer, the second insulating layer being partially removed for exposing spaced-apart top parts of the channel region layer;

a semi-conductive layer selectively formed on the exposed top parts of the channel region layer to define source and drain regions; and electrodes formed on the semi-conductive layer.

2. In a thin film display device according to claim 1; further comprising a high-melting point material layer formed between the semi-conductive layer and the electrodes.

3. A thin film transistor for driving a picture element of an active matrix type display device, comprising: a substrate; a gate region disposed on the substrate; an insulating layer disposed on the gate region; a channel region layer disposed on the insulating layer and opposed to the gate region to define a channel thereon, the channel region layer being composed of an undoped amorphous silicon single layer and having a thickness less than 1000 Å so as to effectively limit the generation of photoelectric current therein caused by light incident on the channel region; and drain and source regions disposed separately from each other in contact with the top portion of the channel region for supplying a drive current to the channel region, the drain and source regions each being comprised of a semi-conductive layer in contact with the channel region and an electrode layer on the semi-conductive layer.

4. A thin film transistor according to claim 3; wherein the insulating layer is composed of SiN.

5. A thin film transistor according to claim 3; wherein the drain and source regions further comprise an intermediate metal layer disposed between the semi-conductive layer and the electrode layer, the intermediate metal layer being composed of high-melting point metal.

6. A thin film transistor according to claim 5; wherein the electrode layer is composed of Al and the intermediate metal layer is composed of Cr or Mo.

7. A thin film transistor according to claim 3; wherein the active matrix type display device comprises a liquid crystal display device.

8. A thin film transistor according to claim 3; wherein the top portion of the channel region is free of a light-shielding layer.

* * * * *